(12) United States Patent
Kuo

(10) Patent No.: US 12,113,099 B2
(45) Date of Patent: Oct. 8, 2024

(54) DEEP TRENCH CAPACITOR INCLUDING STRESS-RELIEF VOIDS AND METHODS OF FORMING THE SAME

(71) Applicant: Taiwan Semiconductor Manufacturing Company Limited, Hsinchu (TW)

(72) Inventor: Fu-Chiang Kuo, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/359,023

(22) Filed: Jul. 26, 2023

(65) Prior Publication Data

US 2023/0369388 A1    Nov. 16, 2023

Related U.S. Application Data

(62) Division of application No. 17/458,706, filed on Aug. 27, 2021.

(51) Int. Cl.
| | | |
|---|---|---|
| H01G 4/35 | (2006.01) | |
| H01L 23/532 | (2006.01) | |
| H01L 49/02 | (2006.01) | |
| H01L 21/285 | (2006.01) | |
| H01L 29/94 | (2006.01) | |

(52) U.S. Cl.
CPC ............. *H01L 28/60* (2013.01); *H01G 4/35* (2013.01); *H01L 21/2855* (2013.01); *H01L 23/5329* (2013.01); *H01L 28/91* (2013.01); *H01L 29/945* (2013.01)

(58) Field of Classification Search
CPC ....... H01L 28/60; H01L 23/642; H01L 28/40; H01L 23/5329; H01L 28/91; H01L 29/945; H01L 21/2855; H01G 4/35; H01G 4/012; H01G 4/08; H01G 4/33
See application file for complete search history.

(56) References Cited

U.S. PATENT DOCUMENTS

| | | | | |
|---|---|---|---|---|
| 6,100,155 A | * | 8/2000 | Hu | H01L 28/40 438/386 |
| 2010/0127309 A1 | * | 5/2010 | de Jong | H01L 23/5223 257/532 |
| 2020/0176552 A1 | * | 6/2020 | Chang | H01L 23/5329 |

* cited by examiner

*Primary Examiner* — Patricia D Valenzuela
(74) *Attorney, Agent, or Firm* — The Marbury Law Group, PLLC

(57) ABSTRACT

A deep trench is formed in a substrate. A layer stack including at least three metallic electrode layers interlaced with at least two node dielectric layers is formed over the substrate. The layer stack continuously extends into the deep trench, and a cavity is present in an unfilled volume of the deep trench. A dielectric fill material layer including a dielectric fill material is formed in the cavity and over the substrate. The dielectric fill material layer encapsulates a void that is free of any solid phase and is formed within a volume of the cavity. The void may expand or shrink under stress during subsequently handling of a deep trench capacitor including the layer stack to absorb mechanical stress and to increase mechanical stability of the deep trench capacitor.

20 Claims, 9 Drawing Sheets

710 — forming a deep trench in a substrate

720 — forming a layer stack including at least three metallic electrode plates interlaced with at least two node dielectric layers over substrate, wherein the layer stack continuously extends into the deep trench, and a cavity is present in an unfilled volume of the deep trench 730 — depositing a dielectric fill material layer comprising a dielectric fill material in the cavity and over the substrate, wherein the dielectric fill material layer encapsulates a void that is free of any solid phase and is formed within a volume of the cavity

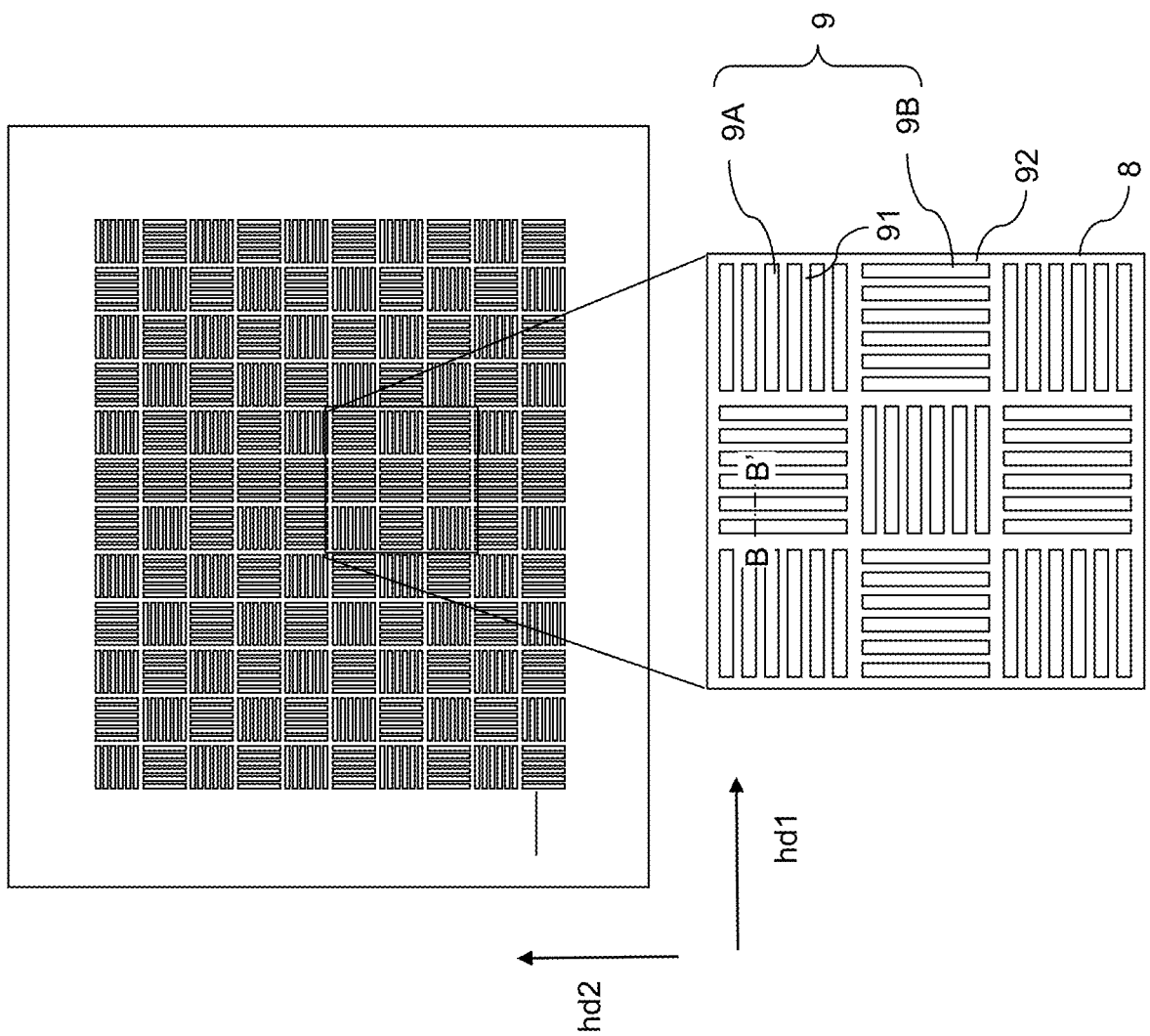

DEEP TRENCH CAPACITOR INCLUDING STRESS-RELIEF VOIDS AND METHODS OF FORMING THE SAME

RELATED APPLICATIONS

This application is a divisional application of U.S. application Ser. No. 17/458,706 entitled "Deep Trench Capacitor Including Stress-Relief Voids and Methods of Forming the Same," filed on Aug. 27, 2021, the entire contents of which are incorporated herein by reference for all purposes.

BACKGROUND

Capacitors are used in semiconductor chips for many applications such as power supply stabilization. However, a significant amount of device area is often used to fabricate such capacitors. Accordingly, capacitors that may provide high capacitance with a small device footprint are desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top-down view of an exemplary structure after formation of deep trenches into a substrate according to an embodiment of the present disclosure. An inset illustrates a magnified view of a portion of the exemplary structure.

DETAILED DESCRIPTION

Figure 1B:
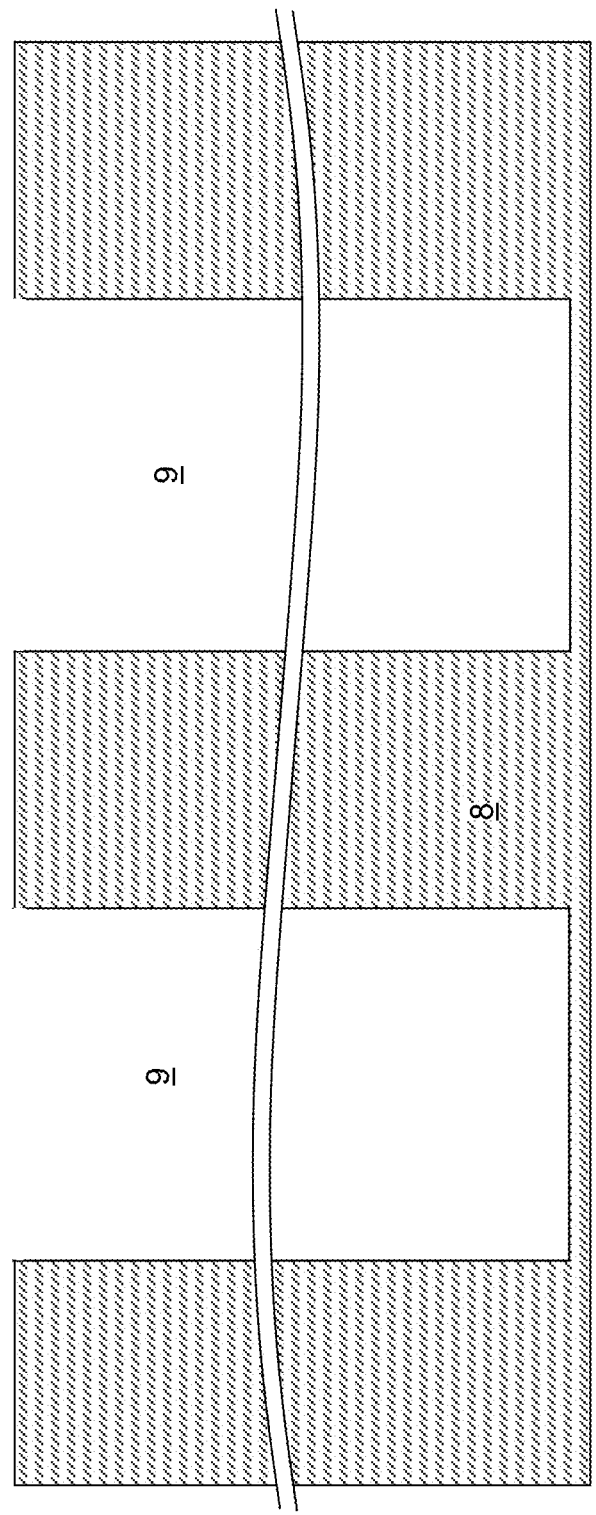
FIG. 1B is a vertical cross-sectional view of a region of the exemplary structure along the vertical plane B-B' of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to a deep trench capacitor including stress-relief voids and methods of forming the same.

Deep trench capacitors may be used as an integrated passive device to provide large capacitance. Such deep trench capacitors may be used to stabilize a power supply and function as a noise filter in handheld devices. Deep trench capacitors may be formed in a first semiconductor die as a component of a power supply circuit. The first semiconductor die may be subsequently bonded to a second semiconductor die which may be a system-on-a-chip (SoC) semiconductor die. Generally, handling of the first semiconductor die after formation of a deep trench capacitor therein may cause mechanical stress to the first semiconductor die. In particular, handling of the first semiconductor die may damage the deep trench capacitor.

According to an aspect of the present disclosure, voids formed within a dielectric fill material layer may accommodate volume changes in the first semiconductor die. Specifically, the dielectric fill material layer may extend into deep trenches of the deep trench capacitor, and may include a material having lower Young's modulus than the materials of the electrodes and node dielectrics of the deep trench capacitor. The dielectric fill material layer and the voids may deform to absorb mechanical stress applied to the deep trench capacitor during handling of the first semiconductor die, such as bonding to the second semiconductor die, and protect the first semiconductor die from external mechanical stress. The various aspects of the present disclosure are now described with reference to accompanying drawings.

Referring to FIGS. 1A and 1B, an exemplary structure according to an embodiment of the present disclosure is illustrated, which comprises a substrate 8 having a planar top surface. The substrate 8 may be a semiconductor substrate including a semiconductor material, and may have a thickness of at least 10 microns. In one embodiment, the substrate 8 may include a commercially available semiconductor wafer that may be diced into semiconductor dies after formation of deep trenches. For example, the substrate 8 may include a semiconductor substrate including single crystalline silicon and having a thickness in a range from 500 microns to 1,500 microns, although thicker or thinner thicknesses may be used.

Deep trenches 9 vertically extending into the substrate 8 may be formed by forming a patterned etch mask layer on the front side surface of the substrate 8. The pattern in the patterned etch mask layer may be transferred to an upper portion of the substrate 8. An optional pad dielectric layer (not shown) such as a silicon oxide pad layer may be formed on the front side surface, i.e., the top surface, of the substrate 8 prior to formation of the patterned etch mask layer. In an exemplary embodiment, the pad dielectric layer may include a silicon oxide layer having a thickness in a range from 20 nm to 100 nm, although thicker or thinner thicknesses may be used.

The patterned etch mask layer may include a silicon nitride layer or a borosilicate glass (BSG) layer having a thickness in a range from 200 nm to 600 nm, although different materials and/or lesser or greater thicknesses may also be used for the optional pad dielectric layer and the patterned etch mask layer. The patterned etch mask layer may be formed by depositing a blanket etch mask layer, forming a lithographically patterned photoresist layer over the blanket etch mask layer, and by transferring the pattern in the lithographically patterned photoresist layer through the blanket etch mask layer using an anisotropic etch process such as a reactive ion etch process.

An anisotropic etch process may be performed to transfer the pattern in the patterned etch mask layer through an upper portion of the substrate 8 to form the deep trenches 9. For example, a reactive ion etch process using a combination of gases including $HBr$, $NF_3$, $O_2$, and $SF_6$ may be used to form the deep trenches 9. The depth of the deep trenches 9 may be in a range from 2 micron to 20 microns, such as from 3 microns to 10 microns, although deeper or shallower trenches may be formed. The horizontal cross-sectional shape of each deep trench 9 may have a shape of a circle, an ellipse, a rectangle, a rounded rectangle, an annulus having an inner periphery and an outer periphery of various shapes, or of any two-dimensional shape that defines an enclosed volume. Generally, at least one deep trench 9 extending downward from a top surface of the substrate may be formed in the substrate 8. The at least one deep trench 9 may comprise a plurality of deep trenches 9 having a depth that is greater than 2 microns.

In one embodiment, each of the deep trenches 9 may be laterally elongated with a uniform width. A predominant portion (such as more than 50% of the entire area) of each deep trench 9 may have a width that is sufficient to accommodate vertically-extending portions of all metallic electrode layers and at least two node dielectric layers to be subsequently formed. For example, a predominant portion of each deep trench 9 may have a width that is sufficient to accommodate vertically-extending portions of at least three metallic electrode layers and at least two node dielectric layers. In an illustrative example, a predominant portion of each deep trench 9 may have a width that is in a range from 50 nm to 1,000 nm, although lesser and greater widths may also be used.

In one embodiment, first-type deep trenches 9A and second-type deep trenches 9B may be formed into an upper portion of the substrate 8. The first-type deep trenches 9A may have first lengthwise sidewalls 91 that laterally extend along a first horizontal direction hd1 and the second-type deep trenches 9B may have second lengthwise sidewalls 92 that laterally extend along a second horizontal direction hd2 that is different from the first horizontal direction hd1. In one embodiment, the second horizontal direction hd2 may be perpendicular to the first horizontal direction hd1.

In one embodiment, clusters of subsets of the first-type deep trenches 9A and clusters of subsets of the second-type deep trenches 9B laterally alternate along at least one direction that is selected from the first horizontal direction hd1 and the second horizontal direction hd2. The second horizontal direction hd2 may be perpendicular to the first horizontal direction hd1. In one embodiment, the clusters of subsets of the first-type deep trenches 9A and clusters of subsets of the second-type deep trenches 9B laterally alternate along the first horizontal direction hd1 and the second horizontal direction hd2.

The photoresist layer may be removed prior to the anisotropic etch process that forms the deep trenches 9, or may be consumed during the anisotropic etch process that forms the deep trenches 9. The patterned etch mask layer and the optional dielectric pad layer may be subsequently removed, for example, by a respective isotropic etch process such as a wet etch process.

Figure 2:
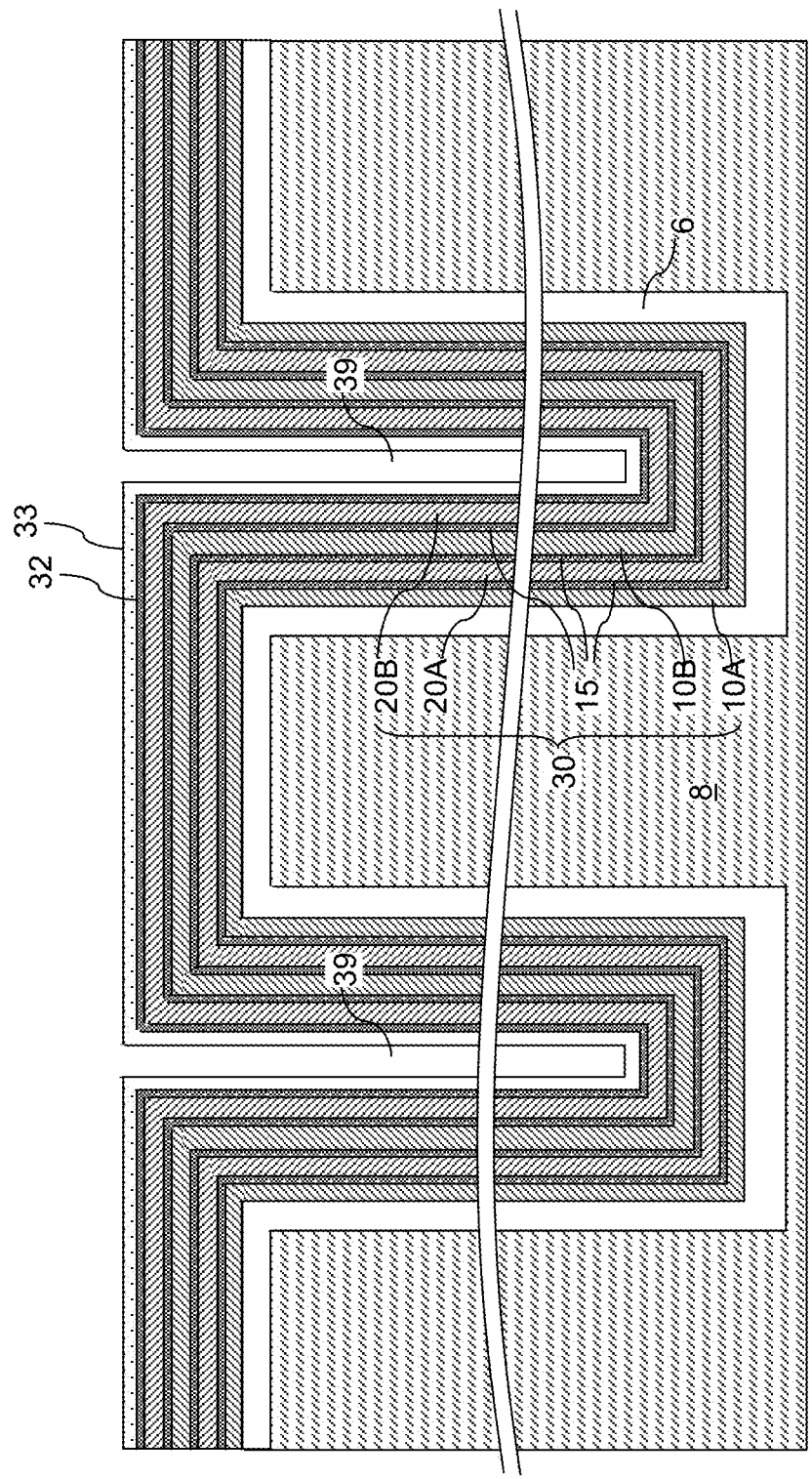
FIG. 2 is a vertical cross-sectional view of a region of the exemplary structure after formation of a layer stack including at least three metallic electrode layers interlaced with at least two node dielectric layers according to an embodiment of the present disclosure.

Referring to FIG. 2, a dielectric liner 6 may be formed on the exposed surface of the semiconductor substrate 8 including the top surface of the semiconductor substrate 8 and sidewalls of the deep trenches 9. The dielectric liner 6 may include a dielectric material that provides electrical isolation between the deep trench capacitors to be subsequently formed and the substrate 8. For example, the dielectric liner 6 may include silicon oxide, silicon nitride, silicon oxynitride, and/or a dielectric metal oxide. Other suitable dielectric liner materials within the contemplated scope of disclosure may also be used. In an illustrative example, the dielectric liner 6 may include a silicon oxide layer formed by thermal oxidation of surface portions of the substrate 8 that includes silicon. The thickness of the dielectric liner 6 may be in a range from 4 nm to 100 nm, although lesser and greater thicknesses may also be used.

An alternating layer stack 30 of metallic electrode layers (10A, 20A, 10B, 20B) and node dielectric layers 15 may be formed by a respective conformal deposition process. The alternating layer stack 30 includes at least three metallic electrode layers (10A, 20A, 10B, 20B) interlaced with at least two node dielectric layers 15, and continuously extending over the top surface of the semiconductor substrate 8 and into each of the at least one deep trench 9. The alternating layer stack 30 continuously extends into each deep trench 9, and a cavity is present in an unfilled volume of each deep trench 9. Generally, the at least three metallic electrode layers (10A, 20A, 10B, 20B) and the at least two node dielectric layers 15 are deposited by a respective conformal deposition process.

Each of the metallic electrode layers (10A, 20A, 10B, 20B) may include a metallic material, which may comprise, and/or consist essentially of, a conductive metallic nitride, an elemental metal, or an intermetallic alloy. In one embodiment, each metallic electrode layer (10A, 20A, 10B, 20B) comprises, and/or consists essentially of, a conductive metallic nitride material, which may be a metallic diffusion barrier material. For example, each metallic electrode layer (10A, 20A, 10B, 20B) may include, and/or may consist essentially of, a conductive metallic nitride material such as TiN, TaN, or WN. Other suitable materials within the contemplated scope of disclosure may also be used.

Use of a metallic diffusion barrier material for the metallic electrode layers (10A, 20A, 10B, 20B) may be advantageous because diffusion of metallic elements through the node dielectric layers 15 and/or through the dielectric liner 6 may cause deleterious effects for deep trench capacitors. Each metallic electrode layer (10A, 20A, 10B, 20B) may be formed by a conformal deposition process such as chemical vapor deposition (CVD) or atomic layer deposition (ALD). The thickness of each metallic electrode layer (10A, 20A, 10B, 20B) may be in a range from 5 nm to 50 nm, such as from 10 nm to 30 nm, although lesser and greater thicknesses may also be used. In one embodiment, each metallic electrode layer (10A, 20A, 10B, 20B) may have the same material composition and the same thickness. In another embodiment, each metallic electrode layer (10A, 20A, 10B, 20B) may have the same material composition but have varying thicknesses. In yet another embodiment, each metallic electrode layer (10A, 20A, 10B, 20B) may have different material composition and the same thickness. In yet another embodiment, each metallic electrode layer (10A, 20A, 10B, 20B) may have different material composition and different thicknesses.

Each of node dielectric layers 15 may include a node dielectric material, which may be a dielectric metal oxide material having a dielectric constant greater than 7.9 (which is the dielectric constant of silicon nitride), i.e., a "high-k" dielectric metal oxide material, or may include silicon nitride. For example, the node dielectric layer 15 may include a dielectric metal oxide material such as aluminum oxide, hafnium oxide, zirconium oxide, tantalum oxide, lanthanum oxide, an alloy or a silicate thereof, and/or a layer stack thereof. In one embodiment, the node dielectric layer 15 may include amorphous aluminum oxide layer that may be subsequently annealed into polycrystalline aluminum oxide material after formation of contact via structures. Other suitable materials within the contemplated scope of disclosure may also be used.

Each node dielectric layer 15 may be formed by a conformal deposition process such as chemical vapor deposition (CVD) or atomic layer deposition (ALD). The thickness of each node dielectric layer 15 may be in a range from 1 nm to 20 nm, such as from 3 nm to 12 nm, although lesser and greater thicknesses may also be used. In one embodiment, each node dielectric layer 15 may have the same material composition and the same thickness. In another embodiment, each node dielectric layer 15 may have the same material composition but have varying thicknesses. In yet another embodiment, each node dielectric layer 15 may have different material composition and the same thickness. In yet another embodiment, each node dielectric layer 15 may have different material composition and different thicknesses. For example, in an embodiment, a first node dielectric layer 15 may be thinner than a second node dielectric layer 15.

The total number of the metallic electrode layers (10A, 20A, 10B, 20B) may be in a range from 3 to 16, such as from 4 to 8. The total number of the node dielectric layers 15 may be one less than the total number of the metallic electrode layers (10A, 20A, 10B, 20B).

While the present disclosure is described using an embodiment in which the alternating layer stack 30 of the metallic electrode layers (10A, 20A, 10B, 20B) and the node dielectric layers 15 include four metallic electrode layers (10A, 20A, 10B, 20B) and three node dielectric layers 15, embodiments are expressly contemplated herein in which different numbers of metallic electrode layers (10A, 20A, 10B, 20B) and different numbers of node dielectric layers 15 may be used within the alternating layer stack 30. Generally, an alternating layer stack 30 may include at least three metallic electrode layers (10A, 20A, 10B, 20B) interlaced with at least two node dielectric layers 15 that may be formed in, and over, at least one deep trench 9 formed in a substrate 8.

The metallic electrode layers (10A, 20A, 10B, 20B) may be sequentially numbered in the order of deposition. For example, the metallic electrode layers (10A, 20A, 10B, 20B) may include a first metallic electrode layer 10A, a second metallic electrode layer 20A, a third metallic electrode layer 10B, a fourth metallic electrode layer 20B, etc. Patterned portions of each odd-numbered metallic electrode layer (10A, 10B) may be subsequently used to form a primary electrode assembly that functions as a primary node, i.e., a first node, of a deep trench capacitor, and patterned portions of each even-numbered metallic electrode layer (20A, 20B) may be subsequently used to form a complementary electrode assembly that functions as a complementary node, i.e., a second node, of the deep trench capacitor. The total number of the metallic electrode layers (10A, 20A, 10B, 20B), the thicknesses of the metallic electrode layers (10A, 20A, 10B, 20B), and the width of the deep trenches 9 may be selected such that a predominant portion (i.e., more than 50%) of the entire volume of each deep trench 9 may be filled with the alternating layer stack 30 without completely filling the deep trench 9.

A capping dielectric material layer 32 and a conformal dielectric liner 33 may be optionally deposited over the alternating layer stack 30. The capping dielectric material layer 32 may include a same dielectric material as the node dielectric layers 15, and may have a thickness in a range from 1 nm to 20 nm, such as from 3 nm to 12 nm, although lesser and greater thicknesses may also be used.

The conformal dielectric liner 33 may be deposited on the capping dielectric material layer 32 or on the alternating layer stack 30. In one embodiment, the conformal dielectric liner 33 comprises, and/or consists essentially of, undoped silicate glass or a doped silicate glass. A cavity 39 may be present within each unfilled volume of the deep trenches 9.

Figure 3:
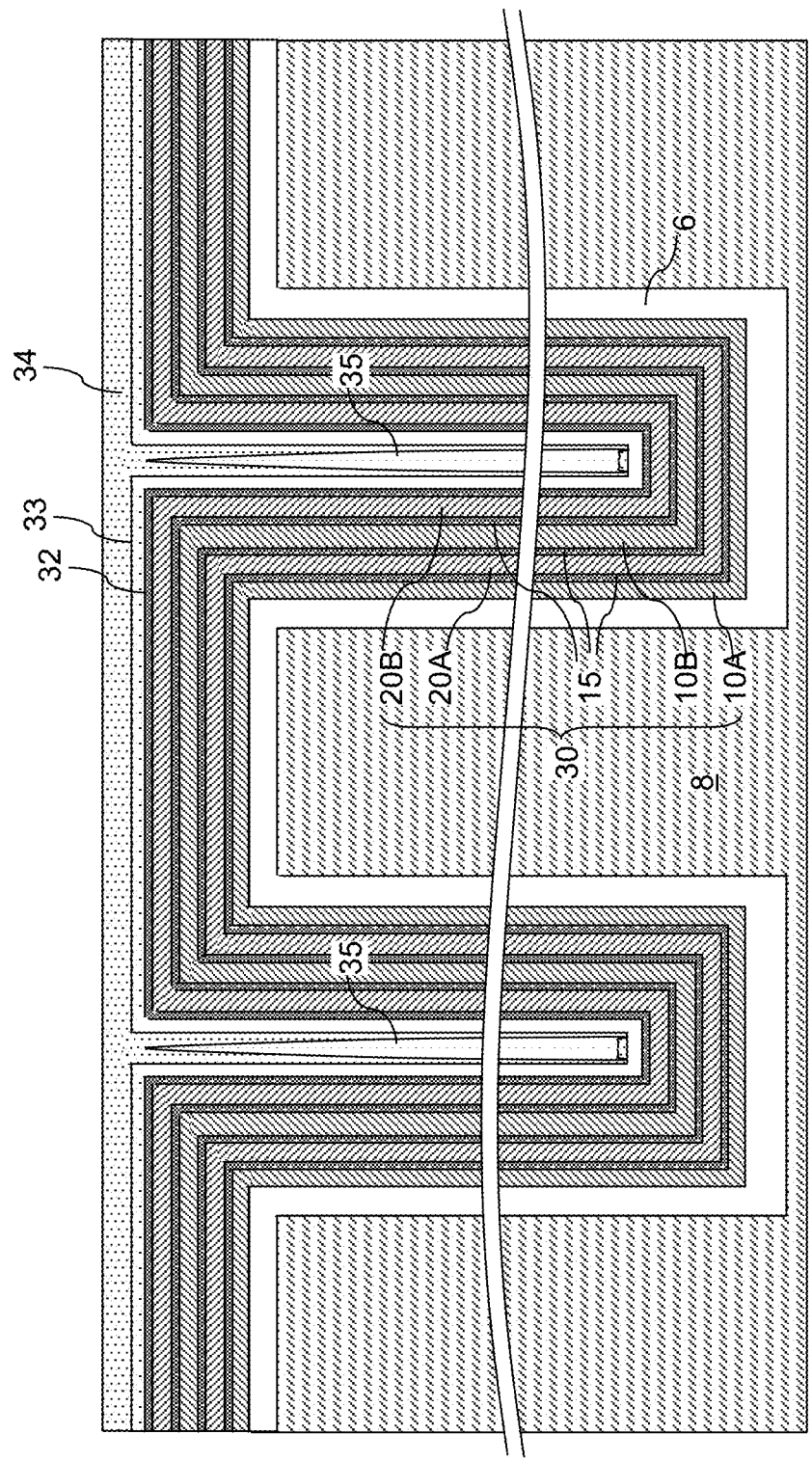
FIG. 3 is a vertical cross-sectional view of a region of the exemplary structure after formation of a dielectric fill material layer and voids encapsulated therein according to an embodiment of the present disclosure.

Referring to FIG. 3, a dielectric fill material layer 34 may be deposited over the semiconductor substrate 8 and within each of the cavities 39. The dielectric fill material layer 34 may be deposited such that voids 35 are encapsulated within the dielectric fill material layer 34.

For example, the dielectric fill material layer 34 may be deposited by a non-conformal deposition process that deposits the dielectric fill material at a higher deposition rate at each opening of the deep trenches 9 than the deposition rate at a bottom portion of the deep trenches 9. Specifically, the dielectric fill material may be deposited at a higher deposition rate at a top portion of each unfilled volume of the deep trenches 9 than at a bottom portion of each unfilled volume of the deep trenches 9. The dielectric fill material layer 34 encapsulates a void 35 that may be free of any solid phase and may be formed within a volume of each cavity 39.

In one embodiment, the dielectric fill material layer 34 may be deposited directly on the conformal dielectric liner and comprises at least one element that is not present within the conformal dielectric liner 33. In one embodiment, the dielectric fill material layer 34 comprises at least one element that is not present within the conformal dielectric liner. In one embodiment, the dielectric fill material layer 34 comprises undoped silicate glass, a doped silicate glass, silicon oxynitride, a silicon oxide carbide, or organosilicate glass.

In one embodiment, Young's modulus of the dielectric fill material layer 34 is less than Young's modulus of a material of the at least three metallic electrode layers (10A, 10B, 20A, 20B), and is less than Young's modulus of a material of the at least two node dielectric layers 15. For example, the at least three metallic electrode layers (10A, 10B, 20A, 20B) may include titanium nitride having Young's modulus of 600 GPa. The at least two node dielectric layers 15 may include aluminum oxide having Young's modulus of 215 GPa or silicon nitride having Young's modulus of about 166 GPa. In this embodiment, the dielectric fill material layer 34 may include undoped silicate glass or a doped silicate glass having Young's modulus of about 70 GPa (i.e., less than Young's modulus of both the dielectric layers 15 and the metallic electrode layers.

The dielectric fill material layer 34 includes a horizontally-extending portion that overlies a topmost surface of the alternating layer stack 30 and at least one vertically-extending portion (which may be a plurality of vertically-extending portions) that extends downward from the horizontally-extending portion into a center region of a respective one of the at least one deep trench 9 (which may be a plurality of deep trenches 9). Each vertically-extending portion of the dielectric fill material layer 34 comprises a respective void 35 that is free of any solid phase material therein.

In one embodiment, each of the at least one vertically-extending portion of the dielectric fill material layer 34 is laterally surrounded by vertically-extending portions of the at least three metallic electrode layers (10A, 10B, 20A, 20B) and the at least two node dielectric layers 15. In one embodiment, each void 35 may be encapsulated by the dielectric fill material layer 34. In one embodiment, all surfaces of each void 35 may be surfaces of the dielectric fill material layer 34.

In one embodiment, each void 35 may have a height-to-width ratio that is greater than 5, such as from 10 to 1,000. In one embodiment, each void 35 may have a height in a range from 1 micron to 20 microns, such as from 2 microns to 10 microns. The width of each void 35 may be in a range from 5 nm to 200 nm, such as from 10 nm to 100 nm, although lesser and greater widths may also be used. The thickness of a horizontal portion of the dielectric fill material layer 34 overlying the top surface of the semiconductor substrate 8 may have a thickness in a range from 50 nm to 300 nm, although lesser and greater thicknesses may also be used.

Figure 4:
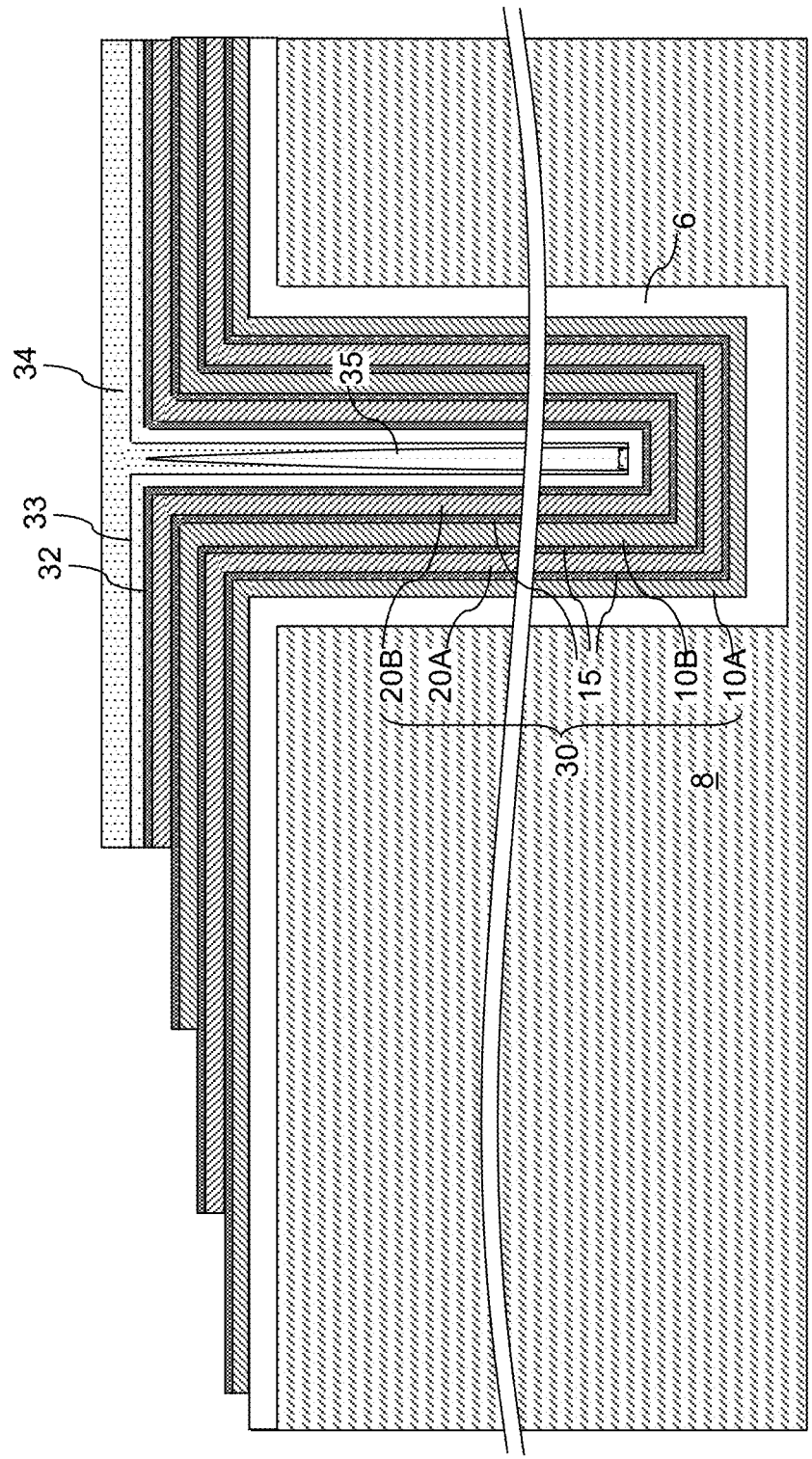
FIG. 4 is a vertical cross-sectional view of a peripheral region of the exemplary structure after patterning the layer stack according to an embodiment of the present disclosure.

Referring to FIG. 4, a trimmable mask layer may be applied over the dielectric fill material layer 34, and may be lithographically patterned to cover the area of the deep trenches 9. A first set of etch processes may be performed to etch unmasked portions of the dielectric fill material layer 34, the conformal dielectric liner 33, the optional capping dielectric material layer 32, and the topmost layer selected from the metallic electrode material layers (10A, 10B, 20A, 20B). The first set of etch processes may include a set of wet etch processes.

Subsequently, the trimmable mask layer may be trimmed to laterally recess the periphery of the trimmable mask layer and to increase the area unmasked by the trimmable mask layer. A second set of etch processes may be performed to etch unmasked portions of the dielectric fill material layer 34, the conformal dielectric liner 33, the optional capping dielectric material layer 32, unmasked portions of the topmost one of the node dielectric layers 15, and unmasked underlying portions of the metallic electrode material layers (10A, 10B, 20A, 20B).

The trimming of the trimmable mask layer and additional sets of etch processes may be repeated to provide stepped surfaces for the metallic electrode material layers (10A, 10B, 20A, 20B). The trimmable mask layer may be subsequently removed, for example, by ashing or by dissolution in a solvent.

Figure 5A:
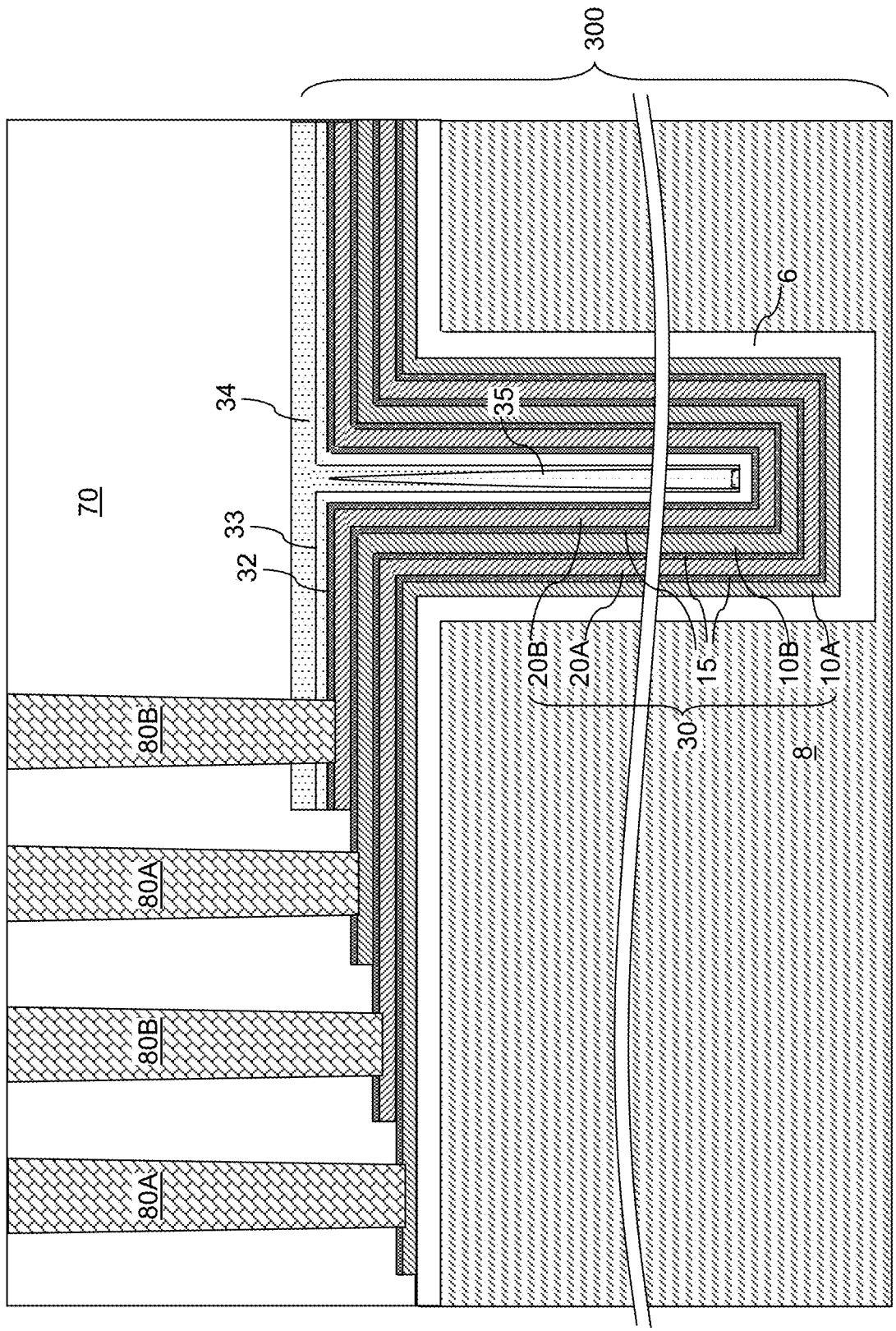
FIG. 5A is a vertical cross-sectional view of the peripheral region of the exemplary structure after formation of a contact-level dielectric layer and contact via cavities according to an embodiment of the present disclosure.
Figure 5B:
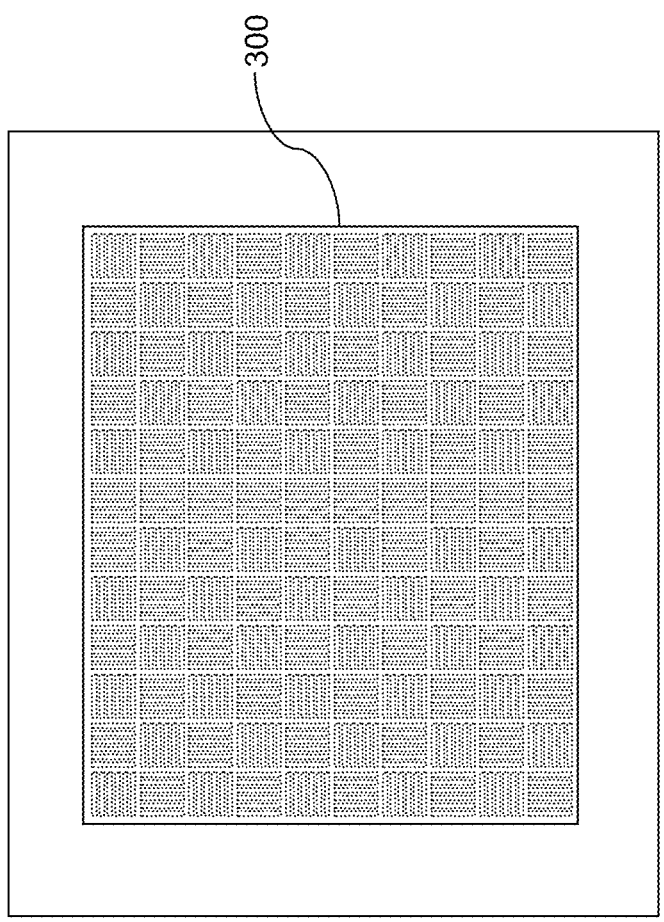
FIG. 5B is a top-down view of the exemplary structure after the processing steps of FIG. 5A.

Referring to FIGS. 5A and 5B, a planarizable dielectric material or a self-planarizing dielectric material may be deposited over the alternating layer stack (10A, 10B, 20A, 20B) and the dielectric fill material layer 34 to form a contact-level dielectric layer 70. The contact-level dielectric layer 70 may have a thickness in a range from 100 nm to 2,000 nm, although lesser and greater thicknesses may also be used.

Contact via structures 80 (80A, 80B) may be formed through the contact-level dielectric layer 70 on a respective one of the metallic electrode material layers (10A, 10B, 20A, 20B). Each of the at least three metallic electrode layers (10A, 10B, 20A, 20B) may be contacted by a respective contact via structure 80 (80A, 80B) embedded within the contact-level dielectric layer 70, which overlies the horizontally-extending portion of the dielectric fill material layer 34.

Additional dielectric material layers (not shown) and additional metal interconnect structures (not shown) may be formed over the contact-level dielectric layer 70 and the contact via structures (80A, 80B) as known in the art. Bonding structures such as copper bonding pads and/or copper bonding pillar structures may be formed over the metal interconnect structures as known in the art. Subsequently, the exemplary structure may be diced into a plurality of semiconductor dies, which may be a capacitor die that may be attached to another semiconductor die. Each semiconductor die may include a deep trench capacitor 300.

Figure 6:
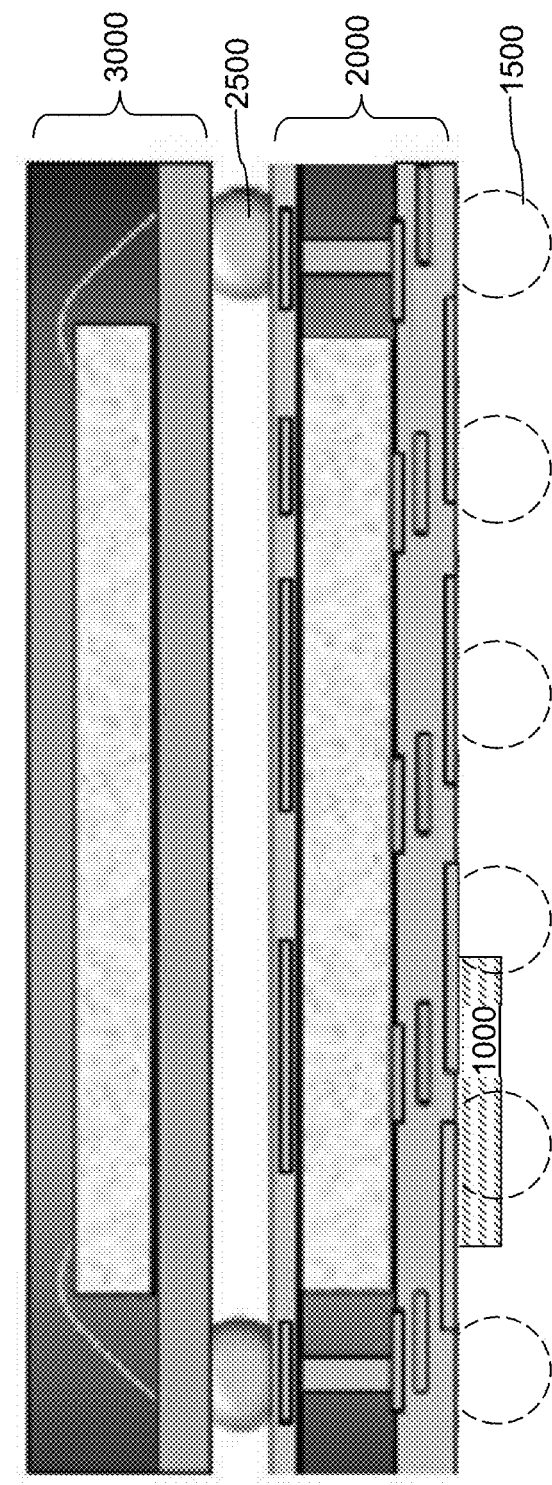
FIG. 6 is a vertical cross-sectional view of an exemplary chip assembly incorporating a semiconductor die containing a deep trench capacitor according to an embodiment of the present disclosure.

Referring to FIG. 6, a non-limiting exemplary application of the semiconductor die derived from the exemplary structure is illustrated. A first semiconductor die 1000 may be provided by performing the processing steps of FIGS. 1A-5B. The first semiconductor die 1000 may be attached to the bottom side of a second semiconductor die 2000. For example, the second semiconductor die 2000 may be a system-on-a-chip (SoC) die 2000, which may be bonded to an integrated fan-out package on package (InFO PoP) die 3000 via an array of solder balls 2500. The second semiconductor die 2000 may be bonded to another module, such as a printed circuit board (PCB) via another array of solder balls 1500. The deep trench capacitor(s) in the semiconductor die 1000 may be used to stabilize the power supply system in the second semiconductor die 2000.

Generally, a first semiconductor die 1000 including a semiconductor substrate 8, an alternating layer stack 30, and a dielectric fill material layer 34 may be provided. A second semiconductor die 2000 including semiconductor devices therein may be provided. The first semiconductor die 1000 may be bonded to the second semiconductor die 2000 through bonding pads or solder material portions.

Referring to all drawings and according to various embodiments of the present disclosure, a deep trench capacitor is provided, which comprises at least one deep trench 9 extending downward from a top surface of a substrate 8; a layer stack 30 including at least three metallic electrode layers (10A, 10B, 20A, 20B) interlaced with at least two node dielectric layers 15 and continuously extending over the top surface of the substrate 8 and into each of the at least one deep trench 9; and a dielectric fill material layer 34 comprising a dielectric fill material and including a horizontally-extending portion that overlies a topmost surface of the layer stack 30 and at least one vertically-extending portion that extends downward from the horizontally-extending portion into a center region of a respective one of the at least one deep trench 9, wherein the at least one vertically-extending portion comprises a void 35 that is free of any solid phase material. In one embodiment, the void 35 has a height-to-width ratio that is greater than 5. In one embodiment, the void 35 is encapsulated by the dielectric fill material layer 34; and all surfaces of the void 35 may be surfaces of the dielectric fill material layer 34.

In one embodiment, each of the at least one vertically-extending portion of the dielectric fill material layer 34 is laterally surrounded by vertically-extending portions of the at least three metallic electrode layers (10A, 10B, 20A, 20B) and the at least two node dielectric layers 15.

In one embodiment, Young's modulus of the dielectric fill material layer 34 is less than Young's modulus of a material of the at least three metallic electrode layers (10A, 10B, 20A, 20B), and is less than Young's modulus of a material of the at least two node dielectric layers 15.

In one embodiment, the at least three metallic electrode layers (10A, 10B, 20A, 20B) comprise a conductive metallic nitride, an elemental metal, or an intermetallic alloy; the at least two node dielectric layers 15 comprise a dielectric metal oxide or silicon nitride; and the dielectric fill material comprises undoped silicate glass, a doped silicate glass, silicon oxynitride, a silicon oxide carbide, or organosilicate glass.

In one embodiment, the deep trench capacitor comprises a conformal dielectric liner 33 located between a topmost layer within the layer stack 30 and the dielectric fill material layer 34. In one embodiment, the conformal dielectric liner 33 comprises undoped silicate glass or a doped silicate glass; and the dielectric fill material layer 34 comprises at least one element that is not present within the conformal dielectric liner such as silicon or oxygen.

In one embodiment, the at least one deep trench 9 comprises a plurality of deep trenches having a depth that is greater than 2 microns; and each of the at least three metallic electrode layers (10A, 10B, 20A, 20B) is contacted by a respective contact via structure (80A, 80B) embedded within a contact-level dielectric layer 70 that overlies the horizontally-extending portion of the dielectric fill material layer 34.

In one embodiment, the substrate 8 comprises a semiconductor material such as silicon; a dielectric liner 6 contacts the top surface of the substrate 8 and sidewalls of the at least one deep trench 9; and the layer stack 30 contacts surfaces of the dielectric liner 6.

According to an aspect of the present disclosure, a semiconductor structure comprising a first semiconductor die 1000 is provided. The first semiconductor die 1000 comprises a semiconductor substrate 8 and a deep trench capacitor 300 embedded within the semiconductor substrate 8. The deep trench capacitor 300 comprises: at least one deep trench 9 extending downward from a top surface of the semiconductor substrate 8; a layer stack 30 including at least three metallic electrode layers (10A, 10B, 20A, 20B) interlaced with at least two node dielectric layers 15 and continuously extending over the top surface of the semiconductor substrate 8 and into each of the at least one deep trench 9; and a dielectric fill material layer 34 including a vertically-extending portion that is located within one of the at least one deep trench 9, is laterally surrounded by the layer stack 30, and encapsulates a void 35 that is free of any solid phase material.

In one embodiment, the semiconductor structure comprises a second semiconductor die 2000 that is bonded to the first semiconductor die 1000 and comprising semiconductor devices therein, wherein the deep trench capacitor 300 is electrically connected to the semiconductor devices through bonding pads or solder material portions.

In one embodiment, the second semiconductor die 2000 comprises a system-on-a-chip (SoC) die; and the first semiconductor die 1000 has a lesser horizontal cross-sectional area than the second semiconductor die 2000.

Figure 7:
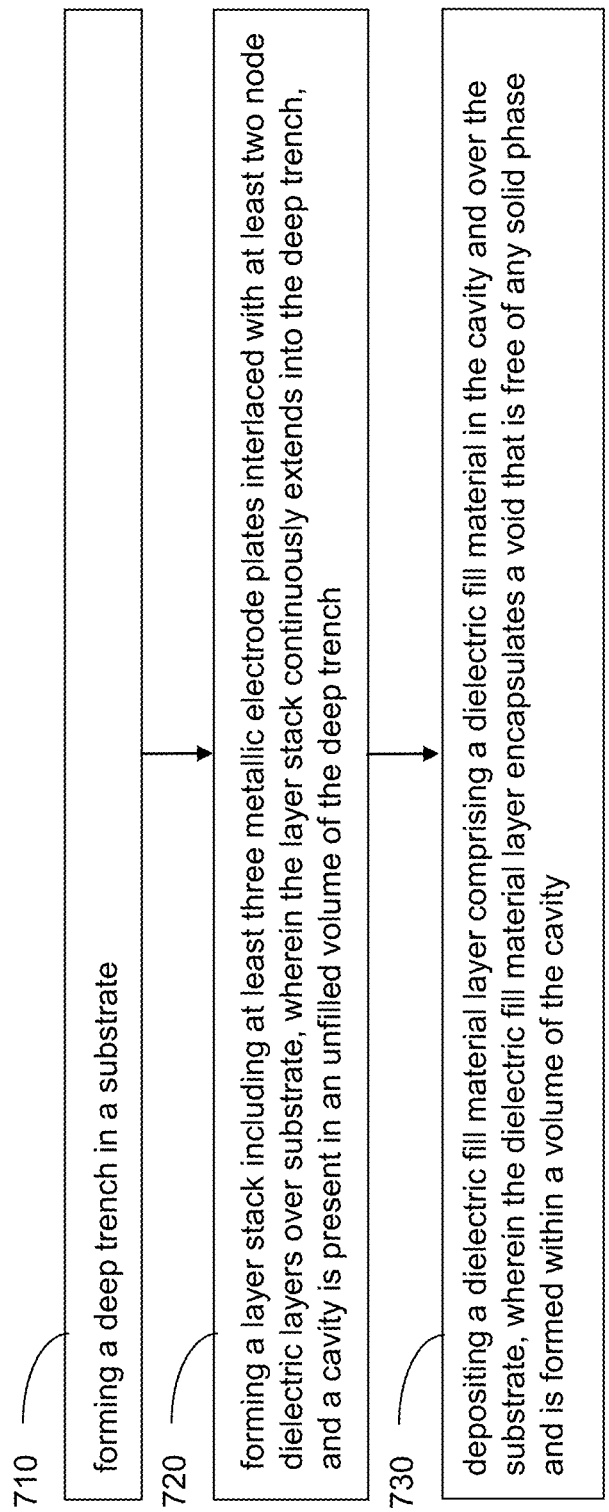
FIG. 7 is a flowchart that illustrates the general processing steps of the methods of the present disclosure.

FIG. 7 is a flowchart that illustrates the general processing steps of the methods of forming the present disclosure. Referring to step 710 and FIGS. 1A and 1B, a deep trench 9 may be formed in a substrate 8. Referring to step 720 and FIG. 2, a layer stack 30 including at least three metallic electrode layers (10A, 10B, 20A, 20B) interlaced with at least two node dielectric layers 15 may be formed over the substrate 8. The layer stack 30 continuously extends into the deep trench 9, and a cavity 39 is present in an unfilled volume of the deep trench 9. Referring to step 730 and FIG. 3, a dielectric fill material layer 34 comprising a dielectric fill material may be formed in the cavity 39 and over the substrate 8. The dielectric fill material layer 34 encapsulates a void 35 that is free of any solid phase and is formed within a volume of the cavity 39. Subsequently, the processing steps of FIGS. 4-6B may be optionally performed.

The various structures and methods of the present disclosure may be used to provide voids 35 within a deep trench capacitor 300, which may be embodied within a first semiconductor die 1000. The voids 35 and the material of the dielectric fill material layer 34 may deform prior to deformation of the alternating layer stack 30 within a deep trench capacitor to prevent and/or reduce deformation of the alternating layer stack 30 during subsequent handling of the deep trench capacitor 300 within the first semiconductor die 1000. Thus, the voids 35 may increase the yield and/or reliability of the semiconductor die 1000 including a deep trench capacitor 300 during subsequent handling such as bonding with a second semiconductor die 2000 or attachment to a printed circuit board.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
   forming a deep trench in a substrate;
   forming a layer stack including at least three metallic electrode layers interlaced with at least two node dielectric layers over the substrate, wherein the layer stack continuously extends into the deep trench, and a cavity is present in an unfilled volume of the deep trench; and
   depositing a dielectric fill material layer comprising a dielectric fill material in the cavity and over the substrate, wherein the dielectric fill material layer encapsulates a void that is free of any solid phase and is formed within a volume of the cavity such that all surfaces of the void within the dielectric fill material layer are surfaces of the dielectric fill material layer.

2. The method of claim 1, wherein the dielectric fill material layer is deposited by a non-conformal deposition process that deposits the dielectric fill material at a higher deposition rate at an opening of the deep trench than at a bottom portion of the deep trench.

3. The method of claim 1, wherein the at least three metallic electrode layers and the at least two node dielectric layers are deposited by a respective conformal deposition process.

4. The method of claim 1, wherein the at least three metallic electrode layers comprise a conductive metallic nitride, an elemental metal, or an intermetallic alloy.

5. The method of claim 1, wherein the at least two node dielectric layers comprise a dielectric metal oxide or silicon nitride.

6. The method of claim 1, wherein the dielectric fill material layer comprises undoped silicate glass, a doped silicate glass, silicon oxynitride, a silicon oxide carbide, or organosilicate glass.

7. The method of claim 1, further comprising depositing a conformal dielectric liner directly on the layer stack, wherein the conformal dielectric liner comprises undoped silicate glass or a doped silicate glass.

8. The method of claim 7, wherein the dielectric fill material layer is deposited directly on the conformal dielectric liner and comprises at least one element that is not present within the conformal dielectric liner.

9. The method of claim 1, further comprising:
depositing a dielectric liner on a top surface of the substrate and on sidewalls of the deep trench, wherein the layer stack is formed on the dielectric liner;
forming a contact-level dielectric layer over the dielectric fill material layer; and
forming contact via structures through contact-level dielectric layer on a respective one of the at least three metallic electrode layers.

10. The method of claim 1, further comprising:
forming a first semiconductor die including the substrate, the layer stack, and the dielectric fill material layer; and
bonding the first semiconductor die to a second semiconductor die through bonding pads or solder material portions.

11. A method of forming a semiconductor structure, the method comprising:
forming at least one deep trench in an upper portion of a substrate;
forming a layer stack including at least three metallic electrode layers interlaced with at least two node dielectric layers in the at least one deep trench, wherein the layer stack continuously extending over the top surface of the substrate and into each of the at least one deep trench; and
forming a dielectric fill material layer comprising a dielectric fill material and including a horizontally-extending portion that overlies a topmost surface of the layer stack and at least one vertically-extending portion that extends downward from the horizontally-extending portion into a center region of a respective one of the at least one deep trench, wherein the at least one vertically-extending portion comprises a void that is free of any solid phase material such that all surfaces of the void within the at least one vertically-extending portion are surfaces of the dielectric fill material layer.

12. The method of claim 11, wherein each of the at least one vertically-extending portion of the dielectric fill material layer is laterally surrounded by vertically-extending portions of the at least three metallic electrode layers and the at least two node dielectric layers.

13. The method of claim 11, wherein Young's modulus of the dielectric fill material layer is less than Young's modulus of a material of the at least three metallic electrode layers, and is less than Young's modulus of a material of the at least two node dielectric layers.

14. The method of claim 11, wherein:
the at least three metallic electrode layers comprise a conductive metallic nitride, an elemental metal, or an intermetallic alloy; and
the at least two node dielectric layers comprise a dielectric metal oxide or silicon nitride.

15. The method of claim 11, wherein the dielectric fill material layer comprises undoped silicate glass, a doped silicate glass, silicon oxynitride, a silicon oxide carbide, or organosilicate glass.

16. The method of claim 11, wherein the void has a height-to-width ratio that is greater than 5.

17. A method of forming a semiconductor structure, comprising:
forming at least one deep trench extending downward from a top surface of the semiconductor substrate;
forming a layer stack including at least three metallic electrode layers interlaced with at least two node dielectric layers and continuously extending over the top surface of the semiconductor substrate and into each of the at least one deep trench; and
forming a dielectric fill material layer including a void that is free of any solid phase material on the layer stack such that all surfaces of the void within the dielectric fill material layer are surfaces of the dielectric fill material layer.

18. The method of claim 17, wherein the void is formed within a vertically-extending portion of the dielectric fill material layer that is located within one of the at least one deep trench.

19. The method of claim 17, further comprising:
patterning horizontally-extending portions of the layer stack and the dielectric fill material layer;
forming a contact-level dielectric layer over the layer stack and the dielectric fill material layer; and
forming contact via structures through the contact-level dielectric layer on a respective one of the at least three metallic electrode layers, wherein one of the contact via structures vertically extends through, and contacts, a horizontally-extending portion of the dielectric fill material layer.

20. The method of claim 17, wherein Young's modulus of the dielectric fill material layer is less than Young's modulus of a material of the at least three metallic electrode layers, and is less than Young's modulus of a material of the at least two node dielectric layers.

* * * * *